(12) United States Patent
Nagasaka et al.

(10) Patent No.: US 8,196,983 B2
(45) Date of Patent: Jun. 12, 2012

(54) SUBSTRATE ATTRACTING DEVICE AND SUBSTRATE TRANSFER APPARATUS

(75) Inventors: Munetoshi Nagasaka, Nirasaki (JP); Ikuo Ogasawara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1072 days.

(21) Appl. No.: 12/108,150

(22) Filed: Apr. 23, 2008

(65) Prior Publication Data

US 2008/0267741 A1  Oct. 30, 2008

(30) Foreign Application Priority Data

Apr. 24, 2007  (JP) .................................. 2007-113668

(51) Int. Cl.
*B25J 15/06* (2006.01)
(52) U.S. Cl. ........................................ 294/64.2; 414/935
(58) Field of Classification Search ................. 294/64.2, 294/64.3; 414/217, 935
See application file for complete search history.

(56) References Cited

U.S. PATENT DOCUMENTS

| | | | | |
|---|---|---|---|---|
| 4,257,637 A | * | 3/1981 | Hassan et al. | 294/64.3 |
| 6,144,926 A | * | 11/2000 | Ishizawa et al. | 702/94 |
| 6,188,323 B1 | * | 2/2001 | Rosenquist et al. | 340/686.5 |
| 6,322,116 B1 | * | 11/2001 | Stevens | 294/64.3 |
| 6,427,991 B1 | * | 8/2002 | Kao | 269/21 |
| 6,899,788 B2 | * | 5/2005 | Kao | 156/345.53 |
| 7,690,869 B2 | * | 4/2010 | Yo et al. | 406/88 |
| 2002/0163054 A1 | | 11/2002 | Suda | |
| 2003/0033728 A1 | | 2/2003 | Iwasaka et al. | |
| 2004/0150237 A1 | * | 8/2004 | Casarotti et al. | 294/64.1 |
| 2007/0118300 A1 | * | 5/2007 | Mollenkopf et al. | 702/33 |
| 2010/0270452 A1 | * | 10/2010 | Hoshino et al. | 248/363 |

FOREIGN PATENT DOCUMENTS

| | | |
|---|---|---|
| CN | 1216157 A | 5/1999 |
| CN | 1258091 A | 6/2000 |
| CN | 1383215 A | 12/2002 |
| JP | 2000-150610 | 5/2000 |
| JP | 2000-508837 | 7/2000 |
| JP | 2001-353683 | 12/2001 |
| JP | 2002-64130 | 2/2002 |
| JP | 2002-319611 | 10/2002 |
| JP | 2005-74606 | 3/2005 |
| JP | 2006-261377 | 9/2006 |
| KR | 10-2006-0059843 | 6/2006 |

OTHER PUBLICATIONS

Office Action issued Feb. 1, 2011, in Japan Patent Application No. 2007-113668 (with English translation).
Office Action issued Mar. 22, 2011, in Chinese Patent Application No. 200810080551.8 with English translation.

* cited by examiner

Primary Examiner — Charles A Fox
(74) Attorney, Agent, or Firm — Oblon, Spivak, McClelland, Maier & Neustadt, L.L.P.

(57) ABSTRACT

A substrate attracting device includes an attracting body for attracting and holding a substrate to transfer the substrate. The attracting body includes a first attracting unit for attracting and holding a top surface of the substrate according to Bernoulli principle and a second attracting unit for vacuum-attracting and holding a bottom surface of the substrate.

9 Claims, 6 Drawing Sheets

SUBSTRATE ATTRACTING DEVICE AND SUBSTRATE TRANSFER APPARATUS

FIELD OF THE INVENTION

The present invention relates to a substrate attracting device and a substrate transfer apparatus; and, more particularly, to a substrate attracting device and a substrate transfer apparatus capable of attracting and holding a thin substrate such as a semiconductor wafer or the like reliably even when the substrate suffers from warp or camber.

BACKGROUND OF THE INVENTION

Conventionally, such a substrate transfer apparatus is equipped in a processing apparatus for processing a substrate such as a semiconductor wafer or the like. A semiconductor wafer inspection apparatus will be described as one example of the processing apparatus. The inspection apparatus includes a probe chamber for inspecting electrical characteristics of a semiconductor wafer and a loader chamber arranged adjacent to the probe chamber. The probe chamber includes a movable mounting table for supporting the semiconductor wafer, a probe card arranged above the mounting table and an alignment mechanism for aligning a plurality of probes of the probe card with a plurality of electrode pads of the semiconductor wafer.

After aligning the semiconductor wafer, the inspection apparatus performs specific inspection by bringing the semiconductor wafer into electrical contact with the probes of the probe card. The loader chamber includes a receiving part for receiving a plurality of semiconductor wafers on a cassette basis therein and a substrate transfer apparatus (hereinafter referred to as a "wafer transfer apparatus") having a pincette that transfers each of the semiconductor wafers between a cassette and the probe chamber. The semiconductor wafers accommodated in the cassette are taken out sheet by sheet, pre-aligned and transferred to the probe chamber by means of the pincette. After the inspection, the inspected semiconductor wafers are transferred from the probe chamber to their original positions in the cassette.

The pincette is formed as an attracting body for attracting and holding a semiconductor wafer. As examples of the attracting body, there are known a vacuum chuck for vacuum-attracting a semiconductor wafer and a Bernoulli chuck for attracting and holding a semiconductor wafer according to Bernoulli principle, the latter which is disclosed in Japanese Patent Laid-open Publication No. H8-203984. The vacuum chuck is designed to attract and hole the bottom surface of the semiconductor wafer, whereas the Bernoulli chuck is configured to attract and hole the top surface of the semiconductor wafer.

Figure 5:
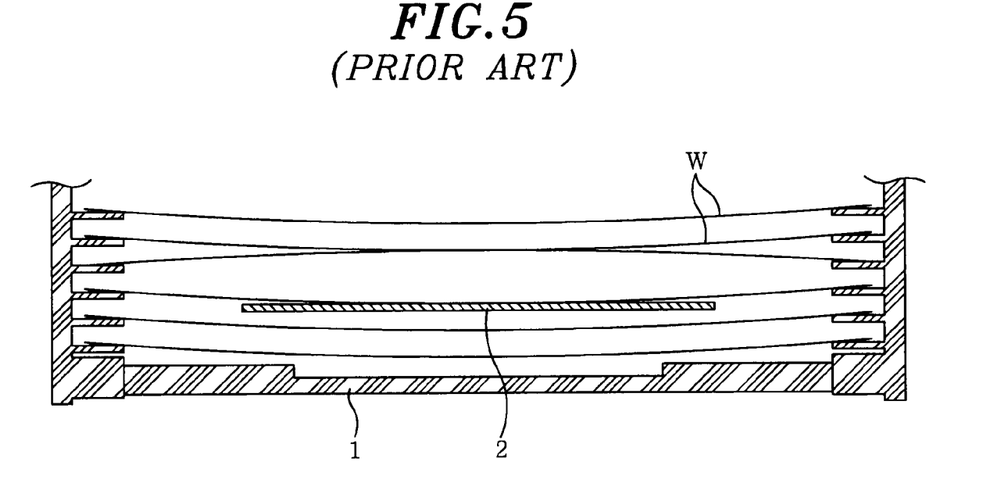
FIG. 5 is a partially cut-away front view illustrating semiconductor wafers received in a cassette.

There is a tendency that semiconductor wafers are becoming thinner for the reason of which the semiconductor wafers are apt to be warped or cambered. Therefore, when a plurality of semiconductor wafers W is received in a cassette 1 in a vertically spaced-apart relationship with one another as shown in FIG. 5, it is sometimes the case that a downwardly cambered semiconductor wafer and an upwardly cambered semiconductor wafer are adjacently placed one atop the other within the cassette 1. In this case, it is impossible to insert a conventional pincette 2 between the upper and lower semiconductor wafers because no gap is left therebetween.

Therefore, one of the upper and lower semiconductor wafers cannot be taken out from the cassette 1. Further, although not shown in the drawings, three pins which are movable up and down are provided in a mounting table and the semiconductor wafer is transferred to/from the mounting table by the pincette in a state that the pins protrude above a mounting surface. Therefore, when the semiconductor wafer to be transferred from the mounting table by the pincette is warped in a downward direction, it is often the case that the pincette cannot be inserted between the semiconductor wafer and the mounting surface if the pincette is a vacuum chuck. In this case, the pins need to be lengthened so that a pincette insertion gap which is large enough to insert the pincette can be created between the semiconductor wafer and the mounting surface.

SUMMARY OF THE INVENTION

In view of the above-noted problems, the present invention provides a substrate attracting device and a substrate transfer apparatus capable of attracting, holding and transferring a substrate such as a semiconductor wafer or the like in a reliable manner by selecting one of upper and lower surfaces of the substrate as an attracted surface depending on the warped or cambered state of the substrate.

In accordance with a first aspect of the present invention, there is provided a substrate attracting device including an attracting body for attracting and holding a substrate to transfer the substrate, wherein the attracting body includes a first attracting unit for attracting and holding a top surface of the substrate according to Bernoulli principle and a second attracting unit for vacuum-attracting and holding a bottom surface of the substrate.

Preferably, the first attracting unit includes a plurality of recess portions formed in a bottom surface of the attracting body and injection holes opened at an inner peripheral surface of each of the recess portions for generating a swirling gas stream within each of the recess portions by injecting a gas into each of the recess portions.

Contact members for forming a gap between the attracting body and the substrate may be provided on the bottom surface of the attracting body so that a horizontal gas stream can be generated in the gap.

The attracting body may be designed to be transformed depending on the size of the substrate.

In accordance with a second aspect of the present invention, there is provided a substrate transfer apparatus including a substrate attracting device having an attracting body for attracting and holding a substrate, the substrate transfer apparatus designed to transfer the substrate by moving the attracting body, wherein the attracting body includes a first attracting unit for attracting and holding a top surface of the substrate according to Bernoulli principle and a second attracting unit for vacuum-attracting and attracting and holding a bottom surface of the substrate.

In accordance with a third aspect of the present invention, there is provided a substrate transfer apparatus including: a detection device for detecting upward and downward deflection of a plurality of substrates received in a housing; a determination unit for determining a deflection direction of each of the substrates based on the detection results of the detection device; and a substrate attracting device having an attracting body for attracting and holding each of the substrates, the substrate transfer apparatus designed to transfer each of the substrates received in the housing by moving the attracting body depending on the determination results of the determination unit.

The attracting body includes a first attracting unit for attracting and holding a top surface of each of the substrates according to Bernoulli principle and a second attracting unit for vacuum-attracting and holding a bottom surface of each of the substrates. The substrate transfer apparatus is designed to automatically select one of the first and the second attracting unit depending on the determination results of the determination unit when each of the substrates is transferred by means of the attracting body.

Preferably, the first attracting unit includes a plurality of recess portions formed in a bottom surface thereof and injection holes opened at an inner peripheral surface of each of the recess portions for generating a swirling gas stream in each of the recess portions by injecting a gas into each of the recess portion.

Contact members for forming a gap between the attracting body and the substrate may be provided on the bottom surface of the attracting body so that a horizontal gas stream can be generated in the gap.

The attracting body may be designed to be transformed depending on the size of the substrate.

In accordance with the present invention, it is possible to provide a substrate attracting device and a substrate transfer apparatus capable of attracting, holding and transferring a substrate such as a semiconductor wafer or the like in a reliable manner by selecting one of upper and lower surfaces of the substrate as an attracted surface depending on the state of warp or camber occurring in the substrate.

BRIEF DESCRIPTION OF THE DRAWINGS

The objects and features of the present invention will become apparent from the following description of embodiments given in conjunction with the accompanying drawings, in which:

FIGS. 1A and 1B show an inspection apparatus to which a substrate transfer apparatus in accordance with an embodiment of the present invention is applied, wherein

FIGS. 2A and 2B show an attracting body of the substrate transfer apparatus shown in FIGS. 1A and 1B, wherein

FIGS. 3A, 3B and 3C illustrate the attracting body shown in FIGS. 2A and 2B, wherein

DETAILED DESCRIPTION OF THE EMBODIMENTS

Hereinafter, embodiments of the present invention will be described with reference to FIGS. 1A to 4B which form a part hereof. However, the present invention is not limited thereto.

Figure 1A:
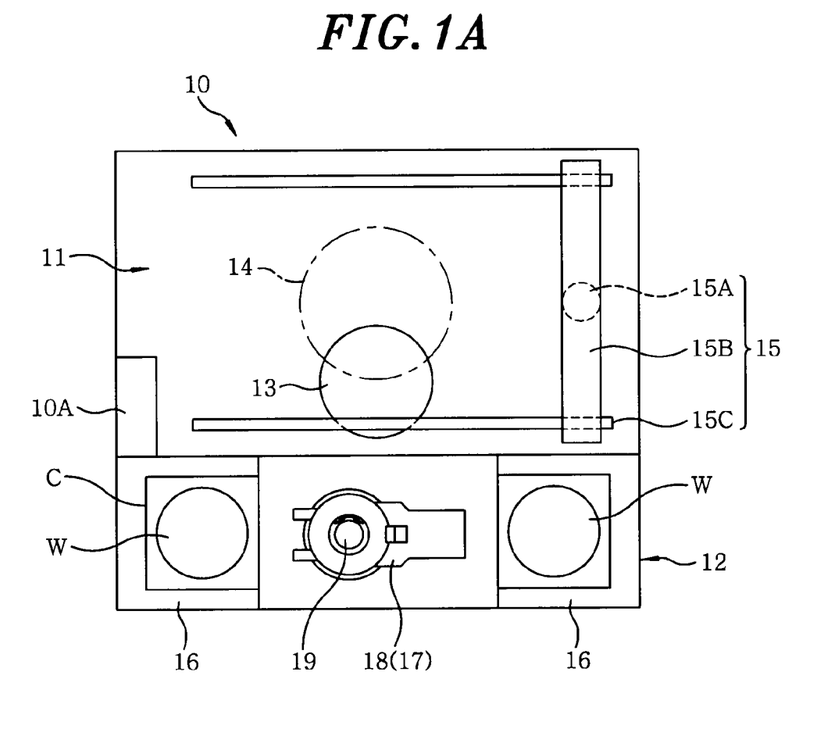
FIG. 1A is a plan view of the inspection apparatus and FIG. 1B is a configuration diagram illustrating the relationship between the substrate transfer apparatus and a cassette in the inspection apparatus shown in FIG. 1A.

As shown in FIG. 1A by way of example, an inspection apparatus 10 in accordance with the embodiment of the present invention includes a probe chamber 11 for inspecting electrical characteristics of a substrate (e.g., a semiconductor wafer) W and a loader chamber 12 provided adjacent to the probe chamber 11 for transferring the semiconductor wafer W. Various kinds of units and mechanisms of the probe chamber 11 and the loader chamber 12 are controlled by a controller 10A.

Figure 1B:
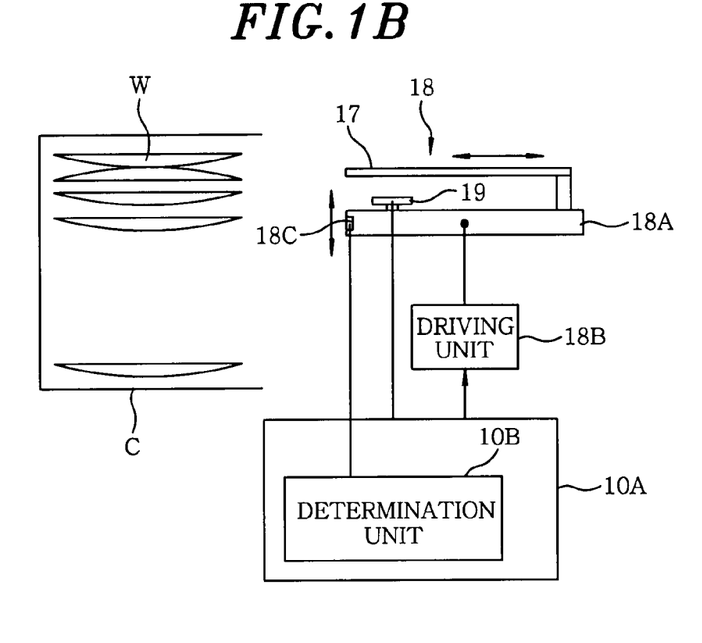

As can be seen in FIGS. 1A and 1B, the probe chamber 11 includes a main chuck 13 for mounting a semiconductor wafer W thereon, the main chuck 13 being movable in X, Y and Z directions, a probe card 14 arranged above the main chuck 13 and an alignment mechanism 15 for bringing a plurality of probes (not shown) of the probe card 14 into alignment with the semiconductor wafer W supported on the main chuck 13. In the probe chamber 11, the semiconductor wafer W is inspected under the control of a controller 10A. The alignment mechanism 15 includes a camera 15A for imaging the semiconductor wafer W supported on the main chuck 13, an alignment bridge 15B to which the camera 15A is attached, and a pair of guide rails 15C for guiding movement of the alignment bridge 15B between an initial position and a probe center (a position just below the center of the probe card). The alignment mechanism 15 aligns the semiconductor wafer W with the probes in cooperation with a camera (not shown) attached to the main chuck 13.

As shown in FIG. 1A, the loader chamber 12 includes first and second loading ports 16 and 16 arranged in a front-rear direction for accommodating respective each of which cassettes C that receives a plurality of semiconductor wafers, and a substrate transfer apparatus (hereinafter referred to as a "wafer transfer apparatus") 18 having an attracting body (pincette) 17 disposed between the first and second loading ports 16 and 16. Various kinds of units including the wafer transfer apparatus 18 are operated under the control of a controller 10A. The first and second loading ports 16 and 16 have identical configuration.

As shown in FIGS. 1A and 1B, the wafer transfer apparatus 18 in accordance with the embodiment of the present invention includes a wafer attracting unit having a pincette 17 for transferring a semiconductor wafer W, a driving unit for horizontally moving the pincette 17 across a support base 18A and also for vertically moving the pincette 17 together with the support base 18A, and a mapping sensor 18C for mapping a plurality of semiconductor wafers W received in the cassette C and also for optically detecting camber or warp of each semiconductor wafer W. The pincette 17 is capable of handling semiconductor wafers W of different size and is designed to transfer, e.g., both a six-inch semiconductor wafer W and an eight-inch semiconductor wafer W. The mapping sensor 18C is provided in a part of the wafer transfer apparatus 18, e.g., in a front end portion of the support base 18A as illustrated in FIG. 1B. Further, a sub-chuck 19 is provided on the support base 18A to pre-align the semiconductor wafer W.

Referring to FIGS. 2A to 3C, the pincette 17 of the wafer attracting unit in accordance with the embodiment of the present invention includes a first attracting unit 171 formed in a lower base plate (hereinafter referred to as a "first base plate") for attracting and holding the semiconductor wafer W on the top surface thereof according to Bernoulli principle and a second attracting unit 172 formed in an upper base plate (hereinafter referred to as a "second base plate") for attracting and holding the semiconductor wafer W on the lower surface thereof by sucking an air. The first and second base plates are of an identical contour and are bonded together. The first attracting unit 171 is primarily used in attracting and holding a semiconductor wafer W which is cambered or warped downward so that it cannot be attracted and held by the second attracting unit 172.

Figure 2A:
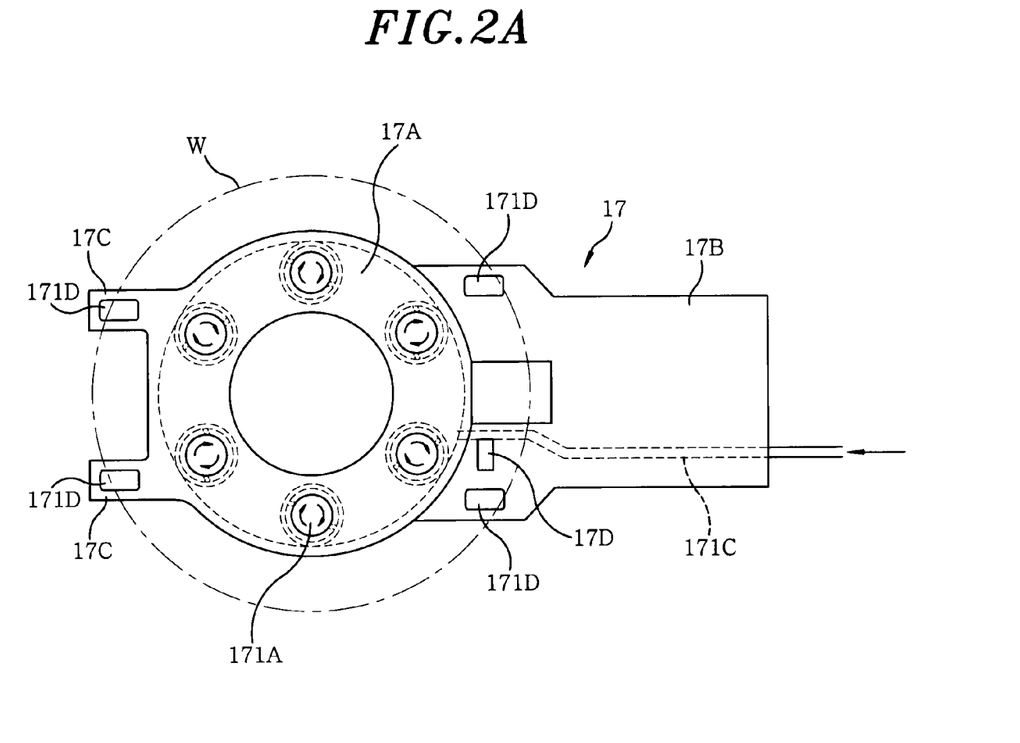
FIG. 2A is a bottom plan view of the attracting body and FIG. 2B is a horizontal half section view illustrating major parts of the attracting body shown in FIG. 2A.
Figure 3A:
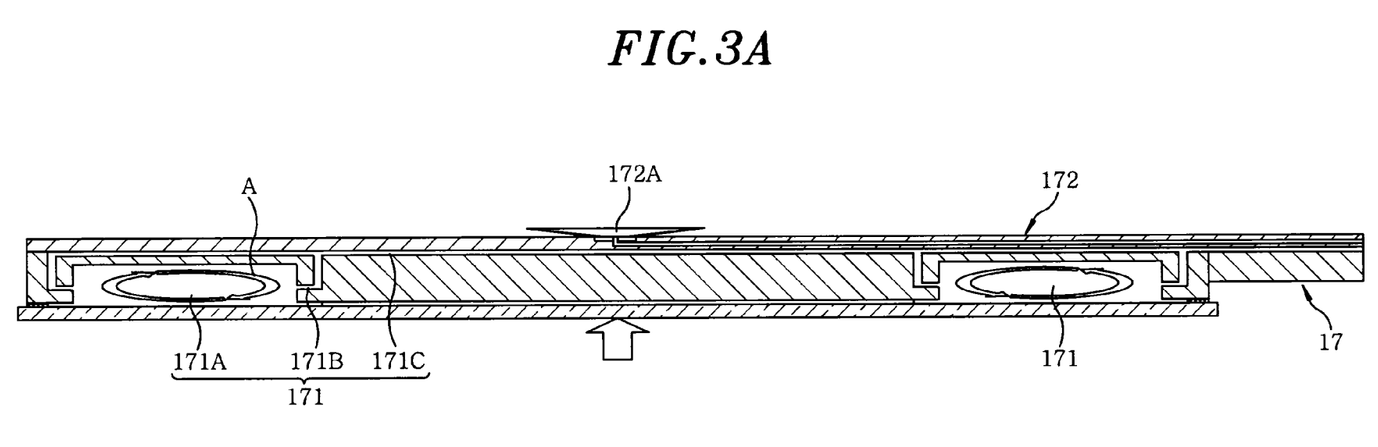
FIG. 3A is a longitudinal section view of the attracting body and FIGS. 3B and 3C are section views enlargedly showing major parts of the attracting body.

As shown in FIGS. 2A and 3A, the pincette 17 includes an annular portion 17A having an outer diameter smaller than the diameter of the semiconductor wafer W and an inner diameter greater than the outer diameter of the sub-chuck 19, a rectangular base portion 17B connected to the base side (the right side) of the annular portion 17A and two protruding portions 17C connected to the leading side (the left side) of the annular portion 17A in a spaced-apart relationship with each other in a width direction. The pincette 17 is adapted to attract and hold the semiconductor wafer W with the annular portion 17A. A wafer sensor 17D is attached to a lower surface of the base portion 17B for detecting the semiconductor wafer W attracted to the lower surface of the pincette 17 by means of the first attracting unit 171. The pincette 17 is designed to be transformed depending on the wafer size, e.g., a six-inch wafer or an eight-inch wafer.

Figure 2B:
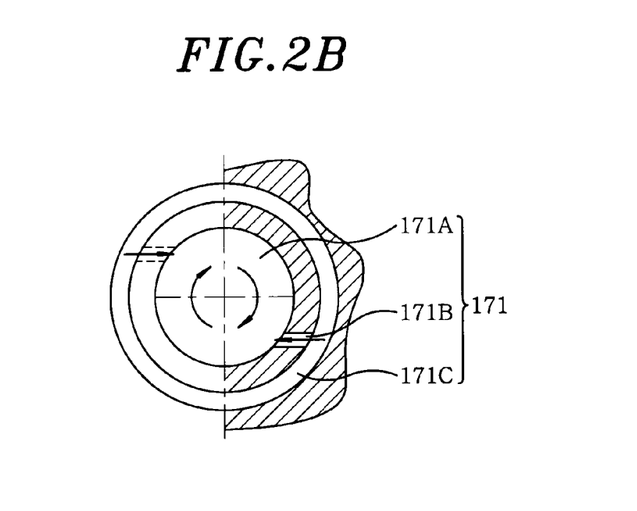
Figure 3B:
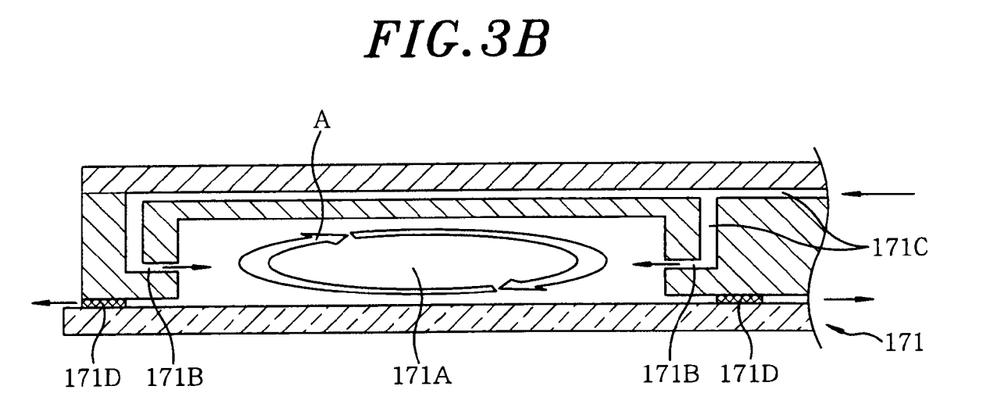

As shown in FIGS. 2A to 3B, the first attracting unit 171 includes a plurality of recess portions 171A (six recess portions in the present embodiment) formed in the bottom surface of the annular portion 17A of the first base plate arranged at regular intervals circumferentially, and injection holes 171B opened at opposite sites that are spaced apart 180 degrees along an inner peripheral surface of each of the recess portions 171A and adapted to generate a swirling gas stream within each of the recess portions 171A by injecting a gas (e.g., air) into each of the recess portions 171A as illustrated in FIGS. 3A and 3B, a first gas channel 171C formed along the annular portion 17A to communicate with the injection holes 171B and a high-pressure gas supply source (not shown) for supplying a high-pressure gas (e.g., air) into the first gas channel 171C.

Four contact members 171D that make contact with the semiconductor wafer W are provided around the bottom surface of the annular portion 17A. Two of the contact members 171D are attached to the base portion 17B while being spaced apart from each other in the width direction. The remaining contact members 171D are attached to the respective protruding portions 17C. These contact members 171D are all made of an elastic material such as rubber or the like so that they can elastically contact with the semiconductor wafer W to leave a gap between the semiconductor wafer W and the annular portion 17A.

As shown in FIGS. 2B, 3A and 3B, the first gas channel 171C is made by forming a groove in an upper surface of the base portion 17B of the first base plate, which groove is connected with a deep annular groove surrounding each of the recess portions 171A to communicate therewith and by bonding the first base plate and the second base plate together. As can be seen in FIG. 2A, the injection holes 171B are formed through the thickness of an annular wall left between the annular groove and the inner peripheral surface of each of the recess portions 171A and are arranged in 180 degrees spaced-apart positions and in a mutually parallel relationship with each other. A high-pressure air is injected through the injection holes 171B toward the opposite inner peripheral surface of each of the recess portions 171A, thereby generating a swirling gas stream within each of the recess portions 171A.

When the high-pressure air is supplied from the high-pressure gas supply source into the first gas channel 171C in a state that the contact members 171D of the pincette 17 make contact with the semiconductor wafer W, the air is speedily injected through the injection holes 171B of each of the six recess portions 171A toward the opposite inner peripheral surface thereof. With the work of the inner peripheral surface of each of the recess portions 171A, a swirling air stream is generated as indicated by an arrow A in FIGS. 3A and 3B. Then, the air is discharged to the outside through the gap between the pincette 17 and the semiconductor wafer W.

At this time, a depressurized space is created inwardly of the swirling air stream within each of the recess portions 171A according to Bernoulli principle. Under the action of a horizontal air stream discharged from each of the recess portions 171A through the gap between the pincette 17 and the semiconductor wafer W, the pressure in the gap between the pincette 17 and the semiconductor wafer W grows smaller than the pressure on the lower surface side of the semiconductor wafer W. Therefore, the pincette 17 can attract and hold the semiconductor wafer W on its lower surface as illustrated in FIG. 3A.

Figure 3C:
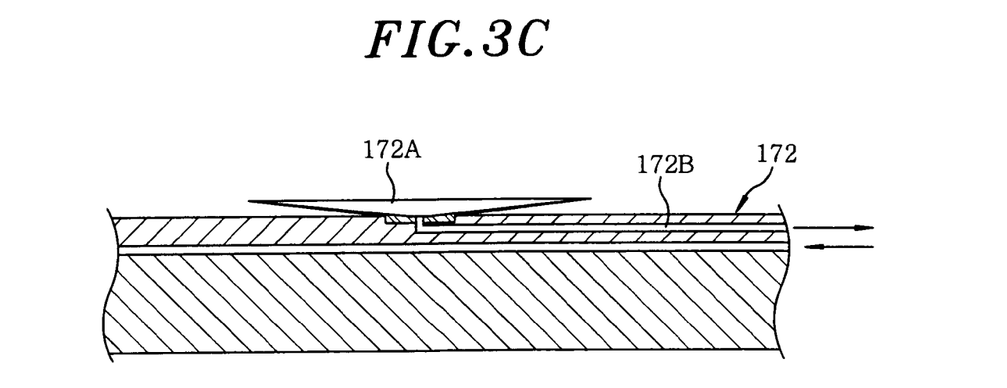

Referring to FIGS. 3A and 3C, the second attracting unit 172 includes two attracting pads 172A attached to the top surface of the annular portion 17A of the second base plate in 180 degrees spaced-apart positions, a second gas channel 172B formed in the second base plate to communicate with an opening of each of the attracting pads 172A and a vacuum pump (not shown) connected to the second gas channel 172B. That is to say, the second attracting unit 172 is formed of a conventional attracting unit using vacuum suction. The two attracting pads 172A are arranged in such a positional relationship that a line interconnecting them remains orthogonal to a linear line passing through the center of the base portion 17B of the pincette 17 in the width direction.

Figure 4A:
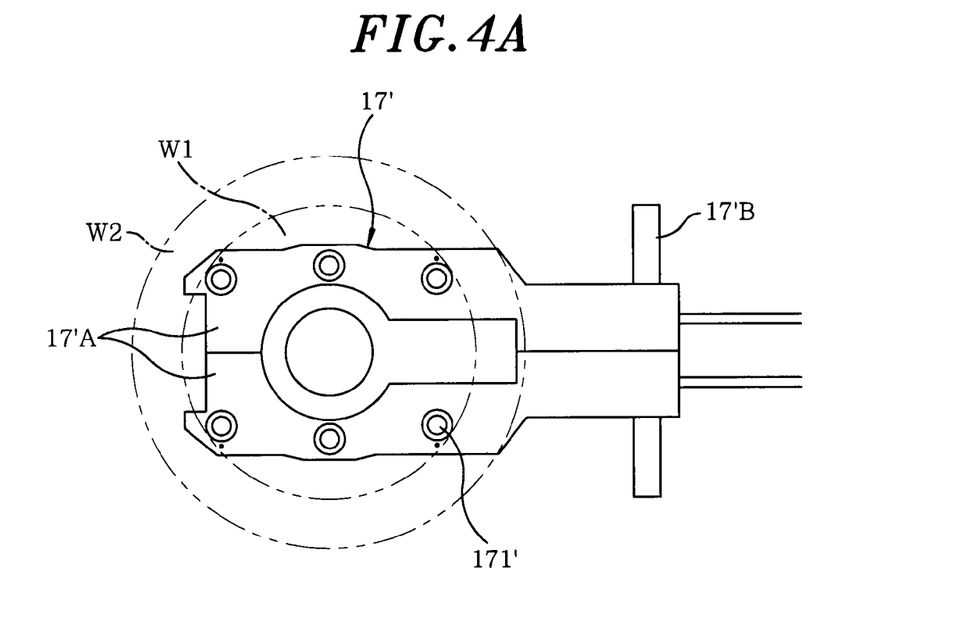
FIGS. 4A and 4B are bottom plan views showing another embodiment of the attracting body.
Figure 4B:
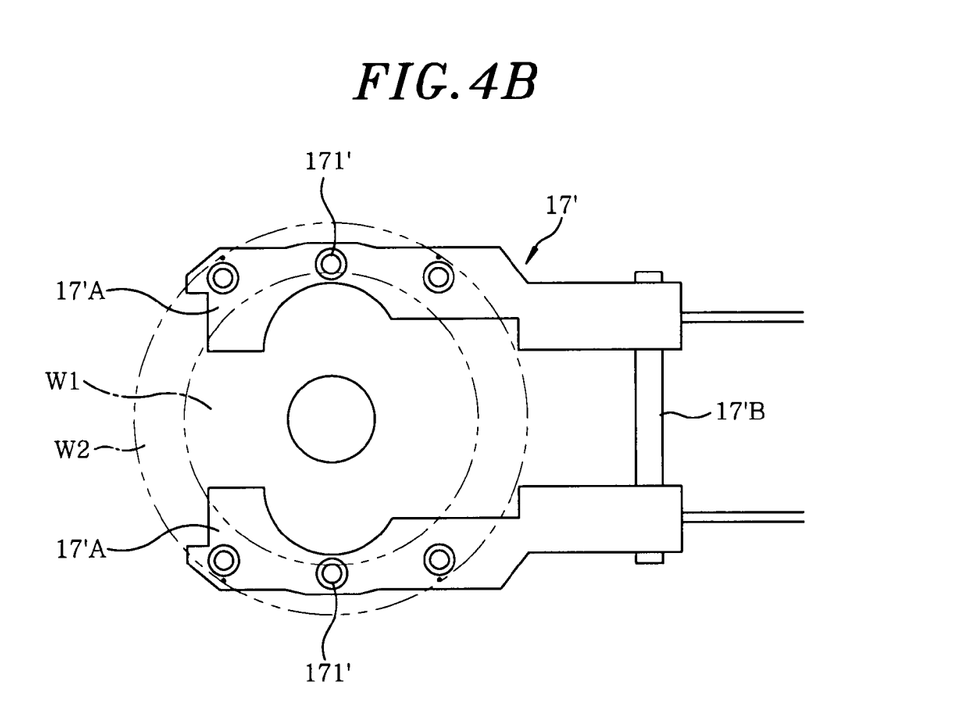

Although the pincette 17 shown in FIGS. 2A to 3C is of an integral body, it may be possible to employ a divided pincette 17' as illustrated in FIGS. 4A and 4B. Referring to FIGS. 4A and 4B, the divided pincette 17' includes a pair of symmetrical left and right pincette parts 17'A. The pincette parts 17'A are connected to each other at their base ends through a rod-like guide member 17'B so that they can be divided apart or coupled together.

In other words, the pincette parts 17'A are designed to be spread apart or closed together according to the size of the semiconductor wafer W while maintaining the left-and-right symmetry. The pincette parts 17'A are closed together as shown in FIG. 4A in order to hold a semiconductor wafer W1 of small diameter. When holding a semiconductor wafer W2 of large diameter, the pincette parts 17'A are spread apart as shown in FIG. 4B. An aperture having a diameter greater than that of the sub-chuck 19 is formed between the pincette parts 17'A when they are closed together. The aperture serves to ensure that, when pre-aligning the semiconductor wafer W1 or W2, the divided pincette 17' is moved up and down with respect to the support surface of the sub-chuck 19 to transfer and receive the semiconductor wafer W1 or W2 to and from the sub-chuck 19.

Just like the pincette 17 described above, the divided pincette 17' includes a first attracting unit 171' arranged on the bottom side thereof and a second attracting unit (not shown) disposed on the top side thereof. The first attracting unit 171' and the second attracting unit have substantially the same construction as those of the pincette 17 set forth above.

The sub-chuck 19 is formed of a conventional vacuum chuck for vacuum-attracting the semiconductor wafer W on its support surface. It may be possible for the sub-chuck 19 to employ a construction by which the semiconductor wafer W is attracted according to Bernoulli principle just like the pincette 17 mentioned above.

Next, description will be made on an operation of the substrate transfer apparatus. First, referring to FIGS. 1A and 1B, the semiconductor wafers W received in the cassette C are mapped by means of the mapping sensor 18C while the pincette 17 of the wafer transfer apparatus 18 is moved up and down by the driving mechanism 18B. At the same time, camber or warpage of each of the semiconductor wafer W is detected and the detection results are stored in the storage part of the controller 10A. Based on the detection results, the determination unit 10B of the controller 10A determines whether the camber or warpage of the semiconductor wafer W is upward or downward. Depending on the determination results, the semiconductor wafer W is attracted by one of the first and second attracting units 171 and 172 of the pincette 17.

For example, when the semiconductor wafer W is warped downwards in the cassette C and therefore the second attracting unit 172 is unable to vacuum-attract the bottom surface of the semiconductor wafer W or when a lower semiconductor wafer W is cambered upwards with an upper semiconductor wafer W warped and therefore there exists no gap therebetween into which the pincette 17 can be inserted, the determination unit 10B of the control unit 10A determines such a situation based on the detection results of the mapping sensor 18C.

Therefore, the pincette 17 of the wafer transfer apparatus 18 is moved into the cassette C through the gap left above the upper semiconductor wafer W so that the upper semiconductor wafer W can be attracted by the first attracting unit 171. In this case, the pincette 17 is moved down within the gap until the contact members 171D make contact with the top surface of the semiconductor wafer W. At the same time, a high-pressure air is supplied to the first attracting unit 171 from the high-pressure gas supply source.

The high-pressure air is allowed to flow through the first gas channel 171C and is injected through the injection holes 171B toward the inner peripheral surface of each of the recess portions 171A, thereby forming a swirling air stream. Then, the high-pressure air is discharged, as a horizontal air stream, to the outside through the gap formed between the semiconductor wafer W and the pincette 17 by means of the contact members 171D. At this time, a depressurized space is created inwardly of the swirling air stream within each of the recess portions 171A according to Bernoulli principle.

Further, due to the horizontal air stream discharged from each of the recess portions 171A through the gap between the pincette 17 and the semiconductor wafer W, the pressure in the gap between the pincette 17 and the semiconductor wafer W grows smaller than the pressure on the bottom surface side of the semiconductor wafer W. Accordingly, the pincette 17 can attract and hold the top surface of the semiconductor wafer W. Once the semiconductor wafer W is attracted and held by the pincette 17, the wafer sensor 17D detects the semiconductor wafer W. In response, the pincette 17 takes out the semiconductor wafer W from the cassette C. Subsequently, the semiconductor wafer W is identified and pre-aligned on the sub-chuck 19 lying above the support base 18A of the wafer transfer apparatus 18.

Then, the tip end of the pincette 17 is headed toward the probe chamber 11 and the pincette 17 is moved to just above the main chuck 13 in the probe chamber 11. The semiconductor wafer W is transferred from the pincette 17 to the mounting surface of the main chuck 13 and is vacuum-attracted by the main chuck 13. Thereafter, the supply of the high-pressure air from the high-pressure gas supply source to the first attracting unit 171 of the pincette 17 is stopped to release the semiconductor wafer W from the pincette 17. The pincette 17 is returned back to the loader chamber 12 and the semiconductor wafer W is inspected in the probe chamber 11.

Once the semiconductor wafer W has been inspected in the probe chamber 11, the pincette 17 is moved from the loader chamber 12 into the probe chamber 11. Using the first attracting unit 171, the pincette 17 attracts and holds the top surface of the semiconductor wafer W mounted on the mounting surface of the main chuck 13 and then returns the semiconductor wafer W back to the original position inside the cassette C received in the loader chamber 12. In case the semiconductor wafer W suffers from great warpage or camber, the pincette 17 cannot be inserted into a space below the semiconductor wafer W even if the semiconductor wafer W is lifted up with the three pins during the process of taking out the inspected semiconductor wafer W from the main chuck 13. This is because the semiconductor wafer W is warped downwards. In this case, the semiconductor wafer W mounted on the mounting surface of the main chuck 13 is directly attracted and held by the first attracting unit 171 of the pincette 17 without having to use the pins as mentioned above. Then, the semiconductor wafer W is returned back to the cassette C in the loader chamber 12.

In case the warpage of the semiconductor wafer W is small so that the bottom surface of the semiconductor wafer W can be vacuum-attracted by means of the second attracting unit 172, the pincette 17 is moved into the gap below the semiconductor wafer W to attract and hold the bottom surface of the semiconductor wafer W with the attracting pad 172A of the second attracting unit 172. Then, the semiconductor wafer W is taken out from the cassette C and mounted on the main chuck 13 in the probe chamber 11. In this case, the three pins of the main chuck 13 protrude from the mounting surface thereof, meaning that the semiconductor wafer W is supported on the support surface by means of the three pins. When the semiconductor wafer W is returned back to the cassette C after the end of inspection, the bottom surface of the semiconductor wafer W is attracted and held by the second attracting unit 172.

In this manner, the determination unit 10B of the controller 10A automatically determines the direction of camber or warpage of the semiconductor wafer W based on the detection results of the mapping sensor 18C. Depending on the determination results, the pincette 17 attracts the top or bottom surface of the semiconductor wafer W by automatically switching the first attracting unit 171 and the second attracting unit 172. This makes it possible to reliably inspect the semiconductor wafers W received in the cassette C without omission.

As described above, the wafer transfer apparatus 18 in accordance with the embodiment of the present invention includes the wafer attracting device having the pincette 17. The pincette 17 includes the first attracting unit 171 that attracts and holds the top surface of the semiconductor wafer W according to Bernoulli principle and the second attracting unit 172 that vacuum-attracts the bottom surface of the semiconductor wafer W. Accordingly, it is possible to reliably attract and hold the semiconductor wafer W and transfer it by automatically selecting one of the first and second attracting units 171 and 172, whichever is more suitable, depending on warpage or camber state of the semiconductor wafers W received in the cassette C.

Further, the wafer transfer apparatus 18 in accordance with the embodiment of the present invention includes the mapping sensor 18C that detects upward and downward deflection (camber and/or warpage) of the semiconductor wafers W received in the cassette C and the determination unit 10B that determines the direction of camber or warpage of each of the semiconductor wafers W based on the detection results of the mapping sensor 18C. This makes it possible to reliably transfer the semiconductor wafer W by automatically selecting one of the first and second attracting units 171 and 172 based on the determination results of the determination unit 10B.

Further, in accordance with the embodiment of the present invention, the first attracting unit 171 includes the six recess portions 171A formed in the bottom surface of the pincette 17 and the injection holes 171B opened at the inner peripheral surface of each of the recess portions 171A for generating a swirling air stream within each of the recess portions 171A by injecting air into the latter. This makes it possible to reliably form a depressurized space within each of the recess portions 171A.

Furthermore, the pincette 17 is provided on its bottom surface with the contact members 171D that serve to create a gap between the pincette 17 and the semiconductor wafer W. A horizontal air stream is formed in the gap, thus making the pressure on the top surface side of the semiconductor wafer W smaller than that on the bottom surface side thereof. This makes it possible to reliably attract and hold the semiconductor wafer W and transfer it.

The present invention is not limited to the embodiments described hereinabove. If necessary, each of the components may be arbitrarily changed or modified. Although the semiconductor wafer W is taken as an example of the substrate in the foregoing embodiments, the present invention may be equally used in attracting and holding thin substrates other than the semiconductor wafer W.

While the invention has been shown and described with respect to the embodiments, it will be understood by those skilled in the art that various changes and modification may be made without departing from the scope of the invention as defined in the following claims.

What is claimed is:

1. A substrate attracting device comprising:
an attracting body for attracting and holding a substrate to transfer the substrate,
wherein the attracting body includes a first attracting unit for attracting and holding a top surface of the substrate according to Bernoulli principle and a second attracting unit for vacuum-attracting and holding a bottom surface of the substrate;
wherein the first attracting unit includes a plurality of recess portions formed in a bottom surface of the attracting body and injection holes opened at an inner peripheral surface of each of the recess portions for generating a swirling gas stream within each of the recess portions by injecting a gas into each of the recess portions,
wherein contact members for forming a gap between the attracting body and the substrate are provided on the bottom surface of the attracting body so that a horizontal gas stream can be generated in the gap, and
wherein the contact members include an elastic material.

2. The substrate attracting device of claim 1, wherein the attracting body is designed to be transformed depending on the size of the substrate.

3. The substrate attracting device of claim 1, wherein a gas channel is in fluid connection with the injection holes and is formed in a groove of an upper surface of a base portion of a base plate of the first attracting unit.

4. A substrate transfer apparatus comprising:
a substrate attracting device having an attracting body for attracting and holding a substrate, the substrate transfer apparatus designed to transfer the substrate by moving the attracting body,
wherein the attracting body includes a first attracting unit for attracting and holding a top surface of the substrate according to Bernoulli principle and a second attracting unit for vacuum-attracting and attracting and holding a bottom surface of the substrate;
wherein the first attracting unit includes a plurality of recess portions formed in a bottom surface thereof and injection holes opened at an inner peripheral surface of each of the recess portions for generating a swirling gas stream in each of the recess portions by injecting a gas into each of the recess portions,
wherein contact members for forming a gap between the attracting body and the substrate are provided on the bottom surface of the attracting body so that a horizontal gas stream can be generated in the gap, and
wherein the contact members include an elastic material.

5. The substrate transfer apparatus of claim 4, wherein the attracting body is designed to be transformed depending on the size of the substrate.

6. A substrate transfer apparatus comprising:
a detection device for detecting upward and downward deflection of a plurality of substrates received in a housing;
a determination unit for determining a deflection direction of each of the substrates based on the detection results of the detection device; and
a substrate attracting device having an attracting body for attracting and holding each of the substrates, the substrate transfer apparatus designed to transfer each of the substrates received in the housing by moving the attracting body depending on the determination results of the determination unit,
wherein the attracting body includes a first attracting unit for attracting and holding a top surface of each of the substrates according to Bernoulli principle and a second attracting unit for vacuum-attracting and holding a bottom surface of each of the substrates and wherein the substrate transfer apparatus is designed to automatically select one of the first and the second attracting unit depending on the determination results of the determination unit when each of the substrates is transferred by means of the attracting body,
wherein the first attracting unit includes a plurality of recess portions formed in a bottom surface thereof and injection holes opened at an inner peripheral surface of each of the recess portions for generating a swirling gas stream in each of the recess portions by injecting a gas into each of the recess portions,
wherein contact members for forming a gap between the attracting body and the substrates are provided on the bottom surface of the attracting body so that a horizontal gas stream can be generated in the gap, and
wherein the contact members include an elastic material.

7. The substrate transfer apparatus of claim 4, wherein a gas channel is in fluid connection with the injection holes and is formed in a groove of an upper surface of a base portion of a base plate of the first attracting unit.

8. The substrate transfer apparatus of claim 6, wherein the attracting body is designed to be transformed depending on the size of the substrate.

9. The substrate transfer apparatus of claim 6, wherein a gas channel is in fluid connection with the injection holes and is formed in a groove of an upper surface of a base portion of a base plate of the first attracting unit.

* * * * *